(12) United States Patent
Tseng

(10) Patent No.: US 6,399,436 B1
(45) Date of Patent: Jun. 4, 2002

(54) METHOD OF MAKING AN ELECTRIC CONDUCTIVE STRIP

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/664,481

(22) Filed: Sep. 18, 2000

(51) Int. Cl.⁷ .......................................... H01L 21/8242
(52) U.S. Cl. .................. 438/249; 438/392; 438/561; 438/396; 438/253; 438/212; 438/259
(58) Field of Search ................... 438/259, 212, 438/239, 253, 396, 243–249, 386–392, 561

(56) References Cited

U.S. PATENT DOCUMENTS

| | | | | |
|---|---|---|---|---|
| 5,770,484 A | * | 6/1998 | Kleinhenz | 438/155 |
| 6,025,245 A | * | 2/2000 | Wei | 438/386 |
| 6,096,598 A | * | 8/2000 | Furukawa et al. | 438/249 |
| 6,100,172 A | * | 8/2000 | Furukawa et al. | 438/561 |
| 6,251,722 B1 | * | 6/2001 | Wei et al. | 438/243 |
| 6,297,088 B1 | * | 10/2001 | King | 438/243 |

\* cited by examiner

*Primary Examiner*—John F. Niebling
*Assistant Examiner*—Jennifer M. Kennedy
(74) *Attorney, Agent, or Firm*—Blakely Sokoloff Taylor & Zafman, LLP

(57) ABSTRACT

A method for manufacturing a conductive strip includes forming a doped dielectric layer along a surface of the barrier, a vertical surface and a lower horizontal surface. Then, an ion-implanted-sensitive resist is formed over the doped dielectric layer. Next step is to implant ions into the ion-implanted-sensitive resist by substantially vertical implantation such that the ion-implanted-sensitive resist over the lower and upper horizontal surfaces is insoluble portions in a developer and the vertical surface is soluble in the developer. Subsequently, the vertical surface is removed by using the developer and then the doped dielectric layer attached on the vertical surface is also removed. Next, a thermal treatment is used to diffuse the dopants in the doped dielectric layer into the lower horizontal surface, and the barrier layer prevent the dopants from diffusing into the upper horizontal surface.

28 Claims, 3 Drawing Sheets

METHOD OF MAKING AN ELECTRIC CONDUCTIVE STRIP

FIELD OF THE INVENTION

The present invention relates to a method of fabricating integrated circuits, and specifically, to a method of the manufacture of electrical conductive lines and, more particularly, to form buried bit line in a trench.

BACKGROUND OF THE INVENTION

The large integration of semiconductor ICs has been accomplished by a reduction in individual device size. As the integration level of semiconductor devices, increases, each cell generally is reduced in size. To provide for such reduction in cell size, various techniques have been used to improve the performance of the device. For example, DRAM has been increased cell capacitance by increasing the effective area of a cell capacitor. To increase the capacitor's effective area, stacked-capacitor and trench-capacitor structures, as well as combinations thereof, have been developed. With this reduction of device size, many challenges arise in the manufacture of the ICs. Each device requires interconnections for exchanging electrical signals from one device to another device. Specially, the high performance integrated circuits have multi-level connections separated by dielectric layers.

Many devices includes conductive lines for performing certain function, such as a bit line contact and a storage node contact must all be formed in a DRAM unit cell. Thus, design rules for minimizing area and ensuring adequate process margin are required. The bit line of the DRAM cell is usually comprised of a metal line, passing through an insulator layer and connecting to the active region. One method of minimizing the amount of area the bit line, of the DRAM device, occupies, is a buried bit line concept. In an effort to circumvent these technological problems, a buried bit line (BBL) cell in which a bit line is buried in the isolation region of a stacked cell, has been suggested. Dennison, in U.S. Pat. No. 5,250,457 has disclosed methods for fabricating a buried bit line.

Further, U.S. Pat. No. 5,840,591 to Park, et al., filed on Nov. 30, 1995, entitled "Method of manufacturing buried bit line DRAM cell". He disclosed a buried bit line DRAM cell which includes a buried bit line formed into a trench. A gate is formed to be orthogonal to the bit line on the substrate. A self-aligned bit line contact formed between a insulating layers for making contact between the drain and the buried bit line, and a self-aligned buried contact formed between the insulating layers for making contact between the source and a storage electrode.

A further method of fabricating a buried bit line includes a trench formed within the substrate by patterning an insulating layer and a substrate. Then a liner oxide is formed on the trench surface and a first conductive layer is then formed on the insulating layer to cover the liner oxide layer and fills the trench. A portion of the first conductive layer is removed, exposing a portion of the liner oxide layer. Next, the exposed liner oxide layer is removed to form a space which, along with the trench, is filled with a second conductive layer on the insulating layer. The detailed method may refer to U.S. Pat. No. 5,882,972, filed on Jul. 10, 1998. The buried bit line technology may also been used for other semiconductor device instead of DRAM. For example, U.S. Pat. No. 6,048,765 to Wu, entitled "Method of forming high density buried bit line flash EEPROM memory cell with a shallow trench floating gate". The method is disclosed for fabricating buried bit line flash EEROM with shallow trench floating gate for suppressing the short channel effect. A further prior art may refer to U.S. Pat. No. 6,100,172, assigned to IBM, filed on Oct. 29, 1998.

As the feature of the circuits is shrinkage, the need for decreasing the electrical resistance associated with electrical connection or contact becomes more important than ever. The higher of the resistance, the slower is the circuits operating speed limited by the RC delay. The present invention will disclose a novel method of the buried bit line for semiconductor device such as DRAM, FLASH, SRAM and so on.

SUMMARY OF THE INVENTION

The object of the present invention is to form a conductive area in a trench by using an ion-implanted-sensitive resist. A method for manufacturing a conductive strip in a substrate having trench. An upper horizontal surface refers to the surface of the substrate. The trench includes vertical surfaces, and a lower horizontal surface. Wherein the upper surface includes a barrier formed thereon, the method comprises forming a doped dielectric layer along a surface of the barrier, the vertical surface and the lower horizontal surface. Then, an ion-implanted-sensitive resist is formed over the doped dielectric layer. Next step is to implant ions into the ion-implanted-sensitive resist by substantially vertical implantation such that the ion-implanted-sensitive resist over the lower and upper horizontal surfaces is insoluble portions in a developer and the vertical surface is soluble in the developer. Subsequently, the vertical surface is removed by using the developer and then the doped dielectric layer attached on the vertical surface is also removed. Next, a thermal treatment is used to diffuse the dopants in the doped dielectric layer into the lower horizontal surface, thereby forming a conductive region and the barrier layer acting as a block to prevent the dopants from diffusing into the upper horizontal surface.

The doped dielectric layer includes phosphorus doped silicate glass or boron doped silicate glass. If the ion-implanted-sensitive resist includes silane-type resist, then the ions implanted by the vertical implantation includes oxygen. Alternatively, if the ion-implanted-sensitive resist includes polysilicon-type resist, then the ions implanted by the vertical implantation includes boron.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of making a conductive line for interconnections such as bit line. The present invention may be applied to any device such as DRAM, SRAM and FLASH. A method for manufacturing a conductive strip in a trench of a substrate. Therefore, the trench has side wall that refers to a vertical surfaces, and the bottom surface of the trench refers to the lower horizontal surface. The surface of the substrate refers to the upper horizontal surface, wherein the upper surface includes barrier formed thereon. The method includes implanting ions into the ion-implanted-sensitive resist by substantially vertical implantation such that ion-implanted-sensitive resist over the lower and upper horizontal surfaces are insoluble portions in a developer and the vertical surface is soluble in the developer.

As will be seen below, turning now to FIG. 1, a substrate 2 is provided, the substrate can be formed of silicon, GaAs, Ge and so on. For example, a single crystal silicon substrate 2 with a <100> crystallographic orientation is shown. Within the substrate 2 may be formed one or more semiconductor devices. The particular devices or their functions are not particularly germane to the present invention. However, the conductive strips for the devices are the subjects of the present invention.

A barrier layer 4 such as silicon oxide layer or silicon nitride layer is then formed on the surface of the substrate 2. The silicon oxide is typically formed by using a thermal oxidation in oxygen ambient. In one embodiment, the silicon dioxide layer is formed by using an oxygen steam ambient, at a temperature of about 800 to 1100° C. Alternatively, the oxide layer may be formed using any suitable oxide chemical compositions and procedures. The silicon nitride layer is deposited by any suitable process. For example, Low Pressure Chemical Vapor Deposition (LPCVD), Plasma Enhance Chemical Vapor Deposition (PECVD), High Density Plasma Chemical Vapor Deposition (HDPCVD). The thickness of the silicon nitride layer is about 1000 to 2000 angstroms. In the preferred embodiment, the reaction gases of the step to form silicon nitride layer include $SiH_4$, $NH_3$, $N_2$, $N_2O$ or $SiH_2Cl_2$, $NH_3$, $N_2$, $N_2O$. Next, the barrier layer is patterned to define a trench region. Then, an etching is used to etch the substrate by using the barrier 4 or a photoresist as an etching mask. A trench 6 is formed by this step. Then, wet clean process may be used to clean the substrate 2. The trench 6 includes a vertical surface and a horizontal surface. Similarly, the upper surface of the substrate is also referred to the horizontal surface.

Figure 1:
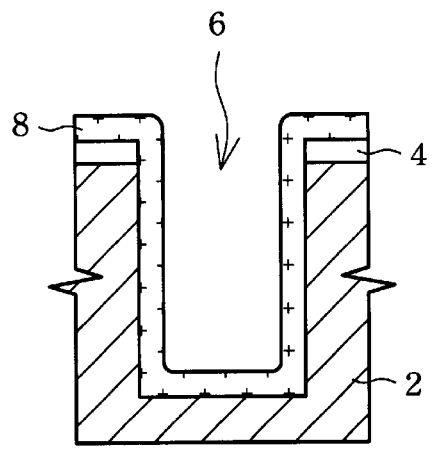
FIG. 1 is a cross sectional view of a semiconductor wafer illustrating the step of forming a doped dielectric layer in accordance with the present invention.
Figure 2:
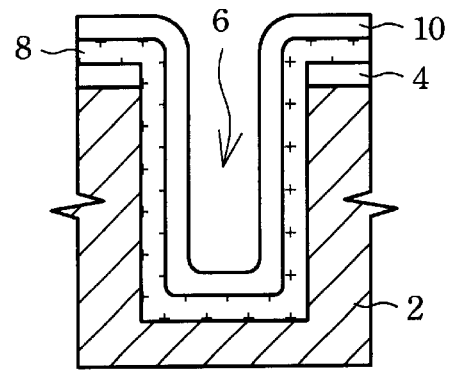
FIG. 2 is a cross sectional view of a semiconductor wafer illustrating the steps of forming an ion-implanted-sensitive resist in accordance with the present invention.
Figure 3:
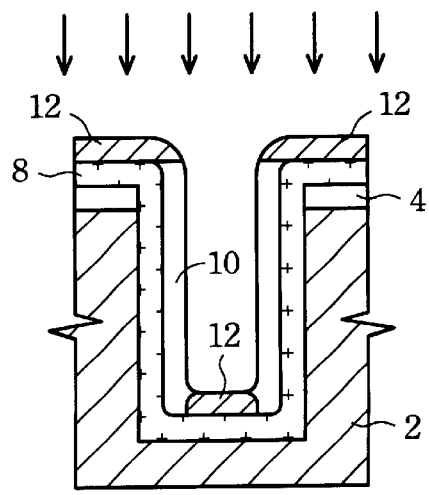
FIG. 3 is a cross sectional view of a semiconductor wafer illustrating the step of performing an ion implantation to implant ions into the ion-implanted-sensitive resist in accordance with the present invention.

Next, a conformal doped dielectric layer 8 is deposited along above etched surface as a doping source, as shown in FIG. 1. As known, the doped dielectric layer 8 may be selected from boron doped silicate glass (BSG), phosphorus doped silicate glass (PSG). Please refer to FIG. 2, a thin conformal layer of ion-implanted-sensitive resist 10 is formed lying on the surface of the doped dielectric layer 8. The art associated to the ion-implanted-sensitive resist 10 may be referred to R. L. Kostelak, J. Vac. Sci. Tech. R, Vol. 13, 1995, p2994–2999. It also can be seen in the literature, T. W. Weidman, A. M. Joshi Appl. Phys. Lett. Vol. 62, 1993, p372–374. Please refer to FIG. 3, the ion-implanted-sensitive resist 10 is deposited from plasma. The ion-implanted-sensitive resist 10 may be deposited with conformal topography by using chemical vapor deposition technique and the material may be activated by oxygen ion implantation or by irradiation with UV illumination in the oxygen ambient. The ion-implanted area occurs chemical reaction, while the un-implanted area remains as the initial material. Therefore, the treated ion-implanted-sensitive resist 10 includes a positive tone and a negative tone. One may select the chemical solution to remove the undesired portion.

In the preferred embodiment, an anisotropical implantation is performed to implant ions into the aforementioned horizontal surface. Oxygen is used as the implanted species, if the ion-implanted-sensitive resist 10 is silane-type resist. If the ion-implanted-sensitive resist 10 is polysilicon-type resist, the implanted ion includes boron. Thus, in the embodiment, the ion-implanted-sensitive resist 10 includes the ion-implanted horizontal portions 12 formed on the horizontal portions of the layers and ion un-implanted vertical portions. The portion lying over the doped dielectric layer 8 and the portion over the bottom surface of the trench 6 is implanted by the step. Namely, the vertical implantation is used to implant ions into the horizontal surface with species, thereby makes the horizontal surface is insoluble in developer and the vertical surface (side wall surface) is soluble. The step is performed by selecting an implant energy that substantially passes through the full thickness of the resist 10.

Figure 4:
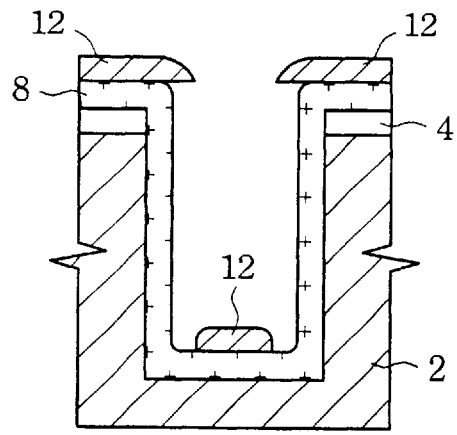
FIG. 4 is a cross sectional view of a semiconductor wafer illustrating the step of removing the un-implanted ion-implanted-sensitive resist in accordance with the present invention.

Referring to FIG. 4, the next step is to remove the un-ion-implanted portion 10 that is attached on the side wall of the trench 6. Preferably, a develop step is carried out by developer to remove the ion-implanted-sensitive resist 10 that is not implanted by ions. The ion-implanted resist is insoluble in developer. The developer may be used depending on the type of the ion-implanted-sensitive resist 10. The vertical portion of the ion-implanted-sensitive resist 10 is removed without effecting the horizontal portion 12. Then, the doped dielectric layer 8 exposed by the residual ion-implanted resist 12 is removed by solution such as HF, BOE (buffer oxide etching) or the like, thereby leaving the layer 8 on the bottom surface of the trench and over the barrier layer 4. The portion formed on the side wall of the trench 6 is stripped, as shown in FIG. 5.

Figure 5:
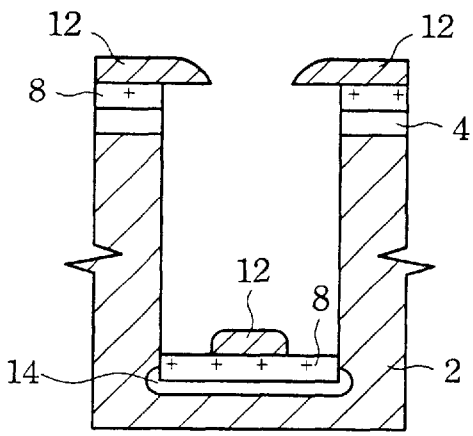
FIG. 5 is a cross sectional view of a semiconductor wafer illustrating the step of removing the doped dielectric layer on the side wall of the trench in accordance with the present invention.

Turning to FIG. 5, the substrate 2 is then thermally treated to cause the dopants in the doped dielectric layer 8 to diffuse into the horizontal surface under the trench 6. The dopant may be diffused into the upper portion of the barrier layer 4, however, the barrier layer 4 is thick enough to preventing the dopant from penetrating through. A buried conductive strip 14 is created by the thermal anneal. The buried conductive strip 14 may be used as buried bit line in DRAM. SRAM, FLASH or interconnection for other device. At the top of the substrate, the dopant is blocked by the barrier layer 4 and thus does not effect the doping concentration of the substrate 2.

Figure 6:
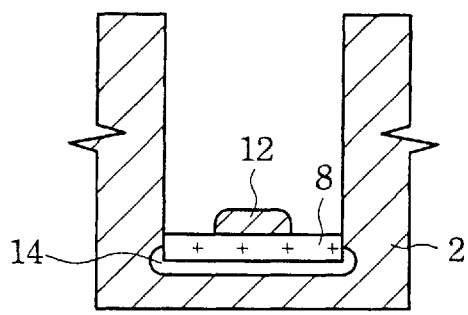
FIG. 6 is a cross sectional view of a semiconductor wafer illustrating the step of removing the ion-implanted-sensitive resist, the doped dielectric layer and the barrier layer in accordance with the present invention.
Figure 7:
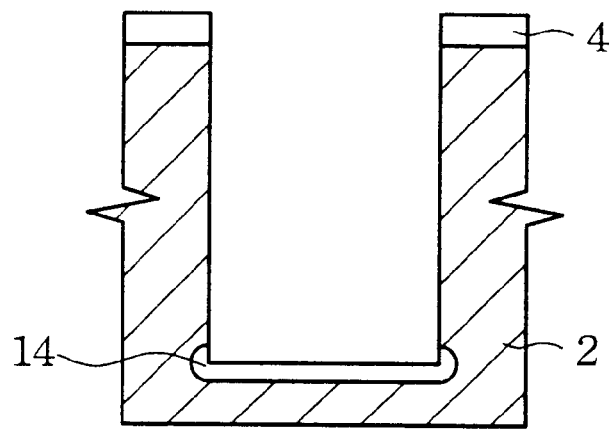
FIG. 7 is a cross sectional view of a semiconductor wafer illustrating the step of lifting the doped dielectric layer in accordance with the present invention.
Figure 8:
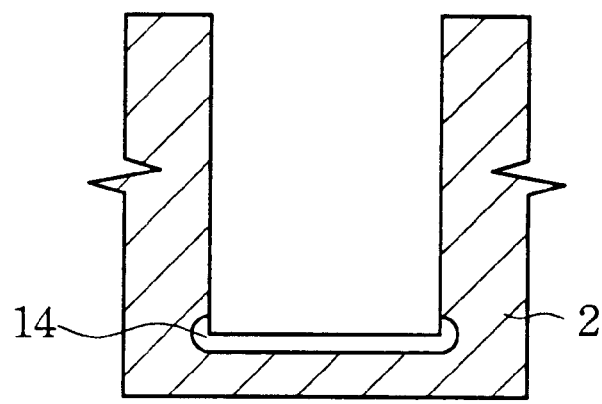
FIG. 8 is a cross sectional view of a semiconductor wafer illustrating the step of lifting the barrier layer in accordance with the present invention.

FIG. 6 shows that the upper ion-implanted resist 12, doped dielectric layer 8 and the barrier layer are respectively removed by chemical mechanical polishing. The same result may be achieved by lifting off the barrier layer. Alternatively, the doped dielectric layer 8 is lift off by solution, as shown in FIG. 7. The lower doped dielectric layer on the bottom of the trench is also removed. Then, the barrier layer 4 may also be removed, as shown in FIG. 8.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a conductive strip for integrated circuits, said method comprising the steps of:
   patterning a barrier layer over a substrate;
   forming a trench into said substrate;
   conformally forming a doped dielectric layer along a surface of said etched substrate and said barrier layer;
   conformally forming an ion-implanted-sensitive resist lying over said doped dielectric layer;
   performing an anisotropical implantation to implant ions into a horizontal portion of said ion-implanted-sensitive resist, thereby generating horizontal insoluble portions and vertical soluble portions;
   removing said vertical soluble portions to expose said doped dielectric layer attached on side walls of said trench;
   removing said doped dielectric layer attached on said side walls of said trench;
   performing a thermal treatment to diffuse dopants in said doped dielectric layer into said substrate under said trench, thereby forming a conductive region and said barrier layer acting as a block to preventing said dopants from diffusing into an upper surface of said substrate.

2. The method of claim 1, further comprising lifting off said barrier layer after said thermal treatment.

3. The method of claim 1, further comprising lifting off said doped dielectric layer after said thermal treatment.

4. The method of claim 3, further comprising removing said barrier layer after lifting off said doped dielectric layer.

5. The method of claim 1, wherein said barrier layer includes nitride or oxide.

6. The method of claim 1, wherein said doped dielectric layer includes boron doped silicate glass.

7. The method of claim 1, wherein said doped dielectric layer includes phosphorus doped silicate glass.

8. The method of claim 1, wherein said ion-implanted-sensitive resist includes silane-type resist.

9. The method of claim 8, wherein said ions implanted by said anisotropical implantation includes oxygen.

10. The method of claim 1, wherein said ion-implanted-sensitive resist includes polysilicon-type resist.

11. The method of claim 10, wherein said ions implanted by said anisotropical implantation includes boron.

12. The method of claim 1, wherein said doped dielectric layer attached on said walls of said trench is removed by HF.

13. The method of claim 1, wherein said doped dielectric layer attached on said walls of said trench is removed by BOE.

14. A method for manufacturing a conductive strip in a substrate having a vertical surface, an upper horizontal surface and a lower horizontal surface, wherein said upper surface includes barrier formed thereon, said method comprising the steps of:
   conformally forming a doped dielectric layer along a surface of said barrier, said vertical surface and a lower horizontal surface;
   conformally forming an ion-implanted-sensitive resist lying over said doped dielectric layer;
   implanting ions into said ion-implanted-sensitive resist by substantially vertical implantation such that said ion-implanted-sensitive resist over said lower and upper horizontal surfaces is insoluble portions in a developer and said vertical surface is soluble in said developer;
   removing said vertical surface by using said developer;
   removing said doped dielectric layer attached on said vertical surface;
   performing a thermal treatment to diffuse the dopants in said doped dielectric layer into said lower horizontal surface, thereby forming a conductive region and said barrier layer acting as a block to prevent said dopants from diffusing into said upper horizontal surface.

15. The method of claim 14, wherein said doped dielectric layer includes phosphorus doped silicate glass.

16. The method of claim 14, wherein said doped dielectric layer includes boron doped silicate glass.

17. The method of claim 14, wherein said ion-implanted-sensitive resist includes silane-type resist.

18. The method of claim 17, wherein said ions implanted by said vertical implantation includes oxygen.

19. The method of claim 14, wherein said ion-implanted-sensitive resist includes polysilicon-type resist.

20. The method of claim 19, wherein said ions implanted by said vertical implantation includes boron.

21. A method for manufacturing a conductive strip for integrated circuits, said method comprising the steps of:
   patterning a barrier layer over a substrate;
   forming a trench into said substrate;
   comformally forming a doped dielectric layer along a surface of said etched substrate and said barrier layer;
   conforrnally forming an ion-implanted-sensitive resist lying over said doped dielectric layer;
   performing an anisotropical implantation to implant ions into a horizontal portion of said ion-implanted-sensitive resist, thereby generating horizontal insoluble portions and vertical soluble portions;
   removing said vertical soluble portions to expose said doped dielectric layer attached on side walls of said trench;
   removing said doped dielectric layer attached on said side walls of said trench;
   performing a thermal treatment to diffuse dopants in said doped dielectric layer into said substrate under said trench, thereby forming a conductive region and said barrier layer acting as a block to preventing said dopants from diffusing into an upper surface of said substrate; and removing said implanted horizontal portions by chemical mechanical polishing after said thermal treatment.

22. The method of claim 21, further including:

removing said doped dielectric layer by chemical mechanical polishing;

removing said barrier layer by chemical mechanical polishing after removing said doped dielectric layer.

23. The method of claim 22, wherein said barrier layer includes nitride or oxide.

24. The method of claim 22, wherein said doped dielectric layer includes boron doped silicate glass.

25. The method of claim 22, wherein said doped dielectric layer includes phosphorus doped silicate glass.

26. The method of claim 22, wherein said ion-implanted-sensitive resist includes silane-type resist.

27. The method of claim 22, wherein said ions implanted by said anisotropical implantation includes oxygen.

28. The method of claim 22, wherein said ion-implanted-sensitive resist includes polysilicon-type resist.

* * * * *